(12) United States Patent
Ryaboy et al.

(10) Patent No.: US 6,966,535 B2
(45) Date of Patent: Nov. 22, 2005

(54) SNUBBER FOR PNEUMATICALLY ISOLATED PLATFORMS

(75) Inventors: Vyacheslav M. Ryaboy, Irvine, CA (US); Worthington B. Houghton, Jr., Newport Beach, CA (US); Herman B. Keil, Cypress, CA (US)

(73) Assignee: Newport Corporation, Irvine, CA (US)

( * ) Notice: Subject to any disclaimer, the term of this patent is extended or adjusted under 35 U.S.C. 154(b) by 350 days.

(21) Appl. No.: 10/142,444

(22) Filed: May 7, 2002

(65) Prior Publication Data

US 2003/0209646 A1  Nov. 13, 2003

(51) Int. Cl.$^7$ .............................................. F16M 1/00
(52) U.S. Cl. ..................... 248/676; 248/560; 248/638; 248/636; 108/20; 108/57.12
(58) Field of Search .............................. 108/20, 57.12, 108/161; 248/676, 678, 560, 562, 638, 636, 248/559; 267/140.1; 188/378

(56) References Cited

U.S. PATENT DOCUMENTS

| | | | |
|---|---|---|---|
| 1,143,165 A | 6/1915 | Begusch | |
| 1,306,906 A | 6/1919 | Jaques, Sr. | |
| 2,060,604 A | * 11/1936 | Bartlett | 248/544 |
| 2,064,751 A | * 12/1936 | Hussman | 248/544 |
| 2,367,139 A | 1/1945 | Ress | |
| 3,357,268 A | 12/1967 | Richter | |
| 3,442,475 A | 5/1969 | Rivin | |
| 3,460,786 A | 8/1969 | Rivin | |
| 3,478,608 A | 11/1969 | Met | |
| 3,533,012 A | 10/1970 | Johnson et al. | |
| 3,565,515 A | 2/1971 | De Mey, II | |
| 3,577,791 A | 5/1971 | Vanden Broek | |
| 3,578,278 A | 5/1971 | Pickering | |
| 3,601,476 A | 8/1971 | MacKenzie | |
| 3,620,558 A | 11/1971 | MacMillan | |
| 3,667,525 A | 6/1972 | Spieth | |
| 3,751,025 A | 8/1973 | Beery et al. | |
| 3,784,146 A | 1/1974 | Mathews | |
| 3,917,201 A | 11/1975 | Roll | |
| 3,945,246 A | 3/1976 | Wadensten | |
| 4,030,811 A | 6/1977 | Khoe et al. | |
| 4,065,203 A | 12/1977 | Goell et al. | |
| 4,079,404 A | 3/1978 | Comerford et al. | |
| 4,088,396 A | 5/1978 | Edelstein | |
| 4,119,363 A | 10/1978 | Camlibel et al. | |
| 4,144,504 A | 3/1979 | Leggett et al. | |
| 4,164,363 A | 8/1979 | Hsu | |
| 4,167,744 A | 9/1979 | Nyul | |

(Continued)

FOREIGN PATENT DOCUMENTS

CA  2199423  3/1996

(Continued)

OTHER PUBLICATIONS

J. M. Kahn, C. A. Burrus, and G. Raybon, High-Stability 1.5 um External-Cavity Semiconductor Lasers for Phase-Lock Applications, Photonics Technology Letters, vol. 1 No. 7, Jul. 1989.

(Continued)

*Primary Examiner*—Kimberly Wood
(74) *Attorney, Agent, or Firm*—Ben J. Yorks; Irell & Manella LLP

(57) ABSTRACT

A table assembly that includes a snubber coupled to both a table and a vibration isolator. The snubber limits relative movement between the table and vibration isolator so that the isolator can more quickly damp movement by the table. The snubber reduces the settling time of the table when subjected to shock and/or vibration loads. The snubber may include one or more rollers coupled to an elastomer.

15 Claims, 3 Drawing Sheets

U.S. PATENT DOCUMENTS

| | | |
|---|---|---|
| 4,199,222 A | 4/1980 | Ikushima et al. |
| 4,237,474 A | 12/1980 | Ladany |
| 4,268,113 A | 5/1981 | Noel, Jr. |
| 4,295,152 A | 10/1981 | Khoe et al. |
| 4,296,998 A | 10/1981 | Dufft |
| 4,316,678 A | 2/1982 | F'Geppert |
| 4,332,469 A | 6/1982 | Wendland |
| 4,350,867 A | 9/1982 | Kinoshita et al. |
| 4,355,323 A | 10/1982 | Kock |
| 4,357,072 A | 11/1982 | Goodfellow et al. |
| 4,387,956 A | 6/1983 | Cline |
| 4,403,243 A | 9/1983 | Hakamada |
| 4,435,037 A | 3/1984 | Abramson et al. |
| 4,469,399 A | 9/1984 | Cowen et al. |
| 4,469,929 A | 9/1984 | Rosen et al. |
| 4,479,698 A | 10/1984 | Landis et al. |
| 4,500,165 A | 2/1985 | Scholl et al. |
| 4,506,108 A | 3/1985 | Kersch et al. |
| 4,523,802 A | 6/1985 | Sakaguchi et al. |
| 4,523,810 A | 6/1985 | Goss et al. |
| 4,525,659 A | 6/1985 | Imahashi et al. |
| 4,550,410 A | 10/1985 | Chenausky et al. |
| 4,615,031 A | 9/1986 | Eales et al. |
| 4,623,220 A | 11/1986 | Grabbe et al. |
| 4,647,147 A | 3/1987 | Pikulski et al. |
| 4,647,331 A | 3/1987 | Koury, Jr. et al. |
| 4,657,429 A | 4/1987 | Morris |
| 4,664,732 A | 5/1987 | Campbell et al. |
| 4,673,244 A | 6/1987 | Miles |
| 4,673,245 A | 6/1987 | Kling et al. |
| 4,677,290 A | 6/1987 | Mitch |
| 4,678,271 A | 7/1987 | Beaulieu |
| 4,679,908 A | 7/1987 | Goodwin |
| 4,701,013 A | 10/1987 | Jurczyszyn et al. |
| 4,702,556 A | 10/1987 | Ishii et al. |
| 4,708,429 A | 11/1987 | Clark et al. |
| 4,714,315 A | 12/1987 | Krause |
| 4,720,163 A | 1/1988 | Goodwin et al. |
| 4,746,195 A | 5/1988 | Auracher et al. |
| 4,747,657 A | 5/1988 | Chaoui et al. |
| 4,748,632 A | 5/1988 | Preston |
| 4,759,600 A | 7/1988 | Caron et al. |
| 4,763,979 A | 8/1988 | Heywang |
| 4,767,174 A | 8/1988 | Carenco et al. |
| 4,773,730 A | 9/1988 | Sedlmayr |
| 4,779,946 A | 10/1988 | Pimpinella et al. |
| 4,779,959 A | 10/1988 | Saunders |
| 4,782,223 A | 11/1988 | Suzuki |
| 4,787,691 A | 11/1988 | Lorenzo et al. |
| 4,800,262 A | 1/1989 | Lentine |
| 4,807,750 A | 2/1989 | Ryder et al. |
| 4,823,220 A | 4/1989 | Milster et al. |
| 4,837,768 A | 6/1989 | Schmid |
| 4,842,397 A | 6/1989 | Eisler |
| 4,850,261 A | 7/1989 | Greene |
| 4,850,671 A | 7/1989 | Finzel |
| 4,854,667 A | 8/1989 | Ebata et al. |
| 4,913,527 A | 4/1990 | Jessop |
| 4,914,867 A | 4/1990 | Saito et al. |
| 4,915,482 A | 4/1990 | Collins et al. |
| 4,916,635 A | 4/1990 | Singer et al. |
| 4,917,211 A * | 4/1990 | Yamada et al. ............... 181/0.5 |
| 4,938,564 A | 7/1990 | Romero |
| 4,966,474 A | 10/1990 | Geiger |
| 4,978,910 A | 12/1990 | Knox et al. |
| 4,988,159 A | 1/1991 | Turner et al. |
| 4,988,165 A | 1/1991 | Ishii et al. |
| 5,000,415 A * | 3/1991 | Sandercock ................ 248/550 |
| 5,044,719 A | 9/1991 | Nakamura |
| 5,058,124 A | 10/1991 | Cameron et al. |
| 5,062,012 A | 10/1991 | Maeda et al. |
| 5,068,749 A | 11/1991 | Patel |
| 5,071,108 A | 12/1991 | Houghton, Jr. |
| 5,077,747 A | 12/1991 | Hemmer et al. |
| 5,132,824 A | 7/1992 | Patel et al. |
| 5,138,496 A | 8/1992 | Pong |
| 5,140,470 A | 8/1992 | Luecke |
| 5,146,532 A | 9/1992 | Hodge |
| 5,150,236 A | 9/1992 | Patel |
| 5,172,160 A | 12/1992 | Van Eijk et al. |
| 5,179,618 A | 1/1993 | Anton |
| 5,183,350 A | 2/1993 | Kramer |
| 5,189,725 A | 2/1993 | Bensel, III et al. |
| 5,191,587 A | 3/1993 | Hanson et al. |
| 5,194,993 A | 3/1993 | Bedzyk |
| 5,214,735 A | 5/1993 | Henneberger et al. |
| 5,218,258 A | 6/1993 | Shirasu et al. |
| 5,218,610 A | 6/1993 | Dixon |
| 5,219,051 A | 6/1993 | Davis |
| 5,245,552 A | 9/1993 | Andersson et al. |
| 5,251,863 A | 10/1993 | Gossman et al. |
| 5,285,995 A * | 2/1994 | Gonzalez et al. ........... 248/550 |
| 5,289,559 A | 2/1994 | Wilson |
| 5,300,755 A | 4/1994 | Nishitani et al. |
| 5,311,278 A | 5/1994 | Rosencher |
| 5,319,435 A | 6/1994 | Melle et al. |
| 5,321,539 A | 6/1994 | Hirabayashi et al. |
| 5,327,061 A | 7/1994 | Gullapalli |
| 5,337,383 A | 8/1994 | DeAngelis et al. |
| 5,367,140 A | 11/1994 | Jonaneh et al. |
| 5,410,145 A | 4/1995 | Coroy |
| 5,428,225 A | 6/1995 | Silva et al. |
| 5,428,635 A | 6/1995 | Zhiglinsky et al. |
| 5,433,422 A * | 7/1995 | Ross et al. ............. 267/140.15 |
| 5,434,944 A | 7/1995 | Kerry et al. |
| 5,434,945 A | 7/1995 | Burek et al. |
| 5,446,519 A | 8/1995 | Makinouchi |
| 5,463,647 A | 10/1995 | Pan |
| 5,469,265 A | 11/1995 | Measures et al. |
| 5,499,261 A | 3/1996 | Welch et al. |
| 5,502,598 A | 3/1996 | Kimura et al. |
| 5,528,718 A | 6/1996 | Ray et al. |
| 5,530,547 A | 6/1996 | Arnold |
| 5,530,785 A | 6/1996 | Sakamoto et al. |
| 5,553,186 A | 9/1996 | Allen |
| 5,563,972 A | 10/1996 | Krausse et al. |
| 5,564,537 A | 10/1996 | Shoureshi |
| 5,570,444 A | 10/1996 | Janssen et al. |
| 5,581,077 A | 12/1996 | Chirovsky et al. |
| 5,598,500 A | 1/1997 | Crespel et al. |
| 5,603,387 A | 2/1997 | Beard et al. |
| 5,617,501 A | 4/1997 | Miller et al. |
| 5,619,609 A | 4/1997 | Pan et al. |
| 5,638,267 A | 6/1997 | Singhose et al. |
| 5,638,482 A | 6/1997 | Winterhoff et al. |
| 5,653,317 A | 8/1997 | Wakui |
| 5,655,045 A | 8/1997 | Morlion et al. |
| 5,660,255 A | 8/1997 | Schubert et al. |
| 5,668,906 A | 9/1997 | Yamamura et al. |
| 5,673,350 A | 9/1997 | Song et al. |
| 5,689,607 A | 11/1997 | Vincent et al. |
| 5,717,804 A | 2/1998 | Pan et al. |
| 5,725,066 A | 3/1998 | Beard et al. |
| 5,737,132 A | 4/1998 | Luecke et al. |
| 5,745,633 A | 4/1998 | Giebel et al. |
| 5,748,821 A | 5/1998 | Schempp et al. |
| 5,751,877 A | 5/1998 | Ishizaka et al. |
| 5,757,561 A | 5/1998 | Sechrist et al. |
| 5,758,004 A | 5/1998 | Alarcon et al. |
| 5,761,360 A | 6/1998 | Grois et al. |
| 5,765,800 A * | 6/1998 | Watanabe et al. ........... 248/550 |
| 5,774,614 A | 6/1998 | Gilliland et al. |
| 5,793,920 A | 8/1998 | Wilkins et al. |
| 5,793,921 A | 8/1998 | Wilkins et al. |

| | | |
|---|---|---|
| 5,794,912 A | 8/1998 | Whittaker et al. |
| 5,795,912 A | 8/1998 | Tsubota |
| 5,812,958 A | 9/1998 | Mayama |
| 5,823,307 A | 10/1998 | Schubert et al. |
| 5,825,558 A | 10/1998 | Farmiga et al. |
| 5,852,519 A | 12/1998 | Do et al. |
| 5,880,894 A | 3/1999 | Blakley |
| 5,909,324 A | 6/1999 | Bryant et al. |
| 5,930,057 A | 7/1999 | Sechrist et al. |
| 5,941,920 A | 8/1999 | Schubert |
| 5,946,023 A | 8/1999 | Blanding |
| 5,963,695 A | 10/1999 | Joyce |
| 6,016,230 A | 1/2000 | Nunnally et al. |
| 6,022,005 A | 2/2000 | Gran et al. |
| 6,056,447 A | 5/2000 | Caras |
| 6,087,621 A | 7/2000 | Kang et al. |
| 6,184,987 B1 | 2/2001 | Jang et al. |
| 6,198,580 B1 | 3/2001 | Dallakian |
| 6,209,841 B1 | 4/2001 | Houghton, Jr. et al. |
| 6,364,274 B1 * | 4/2002 | Omi et al. .................. 248/562 |
| 6,394,407 B1 | 5/2002 | Ryaboy |

FOREIGN PATENT DOCUMENTS

| | | |
|---|---|---|
| GB | 2 124 402 A | 7/1982 |
| GB | 2 131 971 A | 6/1984 |
| JP | 03021894 | 1/1991 |
| JP | 08088167 | 9/1994 |
| JP | 09330875 | 6/1996 |
| JP | 10144601 | 11/1996 |
| WO | WO/96-07118 | 3/1996 |

OTHER PUBLICATIONS

P. Zorabedian and W. R. Trutna, Jr., "Interference-filter-tuned, alignment-stabilized, semiconductor external-cavity laser", 1988, Optical Society of America.

A. Schremer and C. L. Tang, "Single-Frequency tunable external-cavity semiconductor laser using an electro-optic birefringent modulator", Appl. Phys. Lett., vol. 55, No. 1, Jul. 3, 1989.

M. W. Maeda, J. S. Patel, D. A. Smith, Chinlon Lin, M. A. Saifi, and A. Von Lehman, "An Electronically Tunable Fiber Laser with a Liquid-Crystal Etalon Filter as the Wavelength-Tuning Element", IEEE Photonics Technology Letters, vol. 2, No. 11, Nov. 1990.

Katsuhiko Hirabayashi, Hiroyuki Tsuda, and Takashi Kurokawa, "Tunable Liquid-Crystal Fabry-Perot Interferometer Filter for Wavelength-Division Multiplexing Communication Systems", Journal of Lightwave Technology, vol. 11, No. 12, Dec. 1993.

Stephen R. Mallinson, "Wavelength-selective filters for single-mode fiber WDM systems using Fabry-Perot Interferometers", Applied Optics, vol. 26, No. 3, Feb. 1, 1987.

W. Gunning, J. Pasko, J. Tracy, "A liquid crystal tunable spectral filter: visible and infrared operation", SPIE vol. 268 Imaging Spectroscopy (1981).

Hiroyuki Tsuda, Katsuhiko Hirabayashi, Yuichi Tohmori, and Takashi Kurokawa, "Tunable Light Source Using a Liquid-Crystal Fabry-Perot Interferometer", IEEE Photonics Technology Letters, vol. 3. No. 6. Jun. 1991.

John R. Andrews, "Low Voltage Wavelength Tuning of an External Cavity Diode Laser Using a Nematic Liquid Crystal-Containing Birefringent Filert", IEEE Photonics Technology Letters. vol. 2, No. 5, May 1990.

N. A. Olsson and J. P. Van Der Ziel, "Performance Characteristics of 1.5-um External Cavity Semiconductor Lasers for Coherent Optical Communication", Journal Of Lightwave Technology, vol. LT-5. No. 4, Apr. 1987.

Hecht Optics Second Edition, Eugene Hecht, reprinted 1990, reference text, pp. 303 #368.

Rivin, Eugene I., "Vibration isolation of precision equipment", Precision Engineering, 1995, pp. 41-56, vol. 17.

"Marsh Mellow Springs Vibration Isolation Design Manual", 1998, Firestone Industrial Products Company.

Rivin, Eugene I., "Shaped Elastomeric Components for Vibration Control Devices", Sound and Vibration, Jul. 1999, pp. 18-23, vol. 33, No. 7.

* cited by examiner

SNUBBER FOR PNEUMATICALLY ISOLATED PLATFORMS

BACKGROUND OF THE INVENTION

1. Field of the Invention

The subject matter disclosed generally relates to the field of vibration isolated tables.

2. Background Information

Semiconductor devices are fabricated using extremely precise process equipment. The process equipment is located within a clean room facility. Clean room facilities typically have a certain amount of vibration that must be isolated to preserve the accuracy of the process equipment. The process equipment may include vibration isolators that isolate a platform or table of the equipment from the vibrating floor of the facility.

The process equipment may include robotic arms and other automated components that move the wafers to and from processing stations. Movement of the wafers can create shock and vibration in the equipment. The shock and vibration can create movement in the equipment which decreases the accuracy of the process. The process typically includes a settling time to compensate for vibration in the system. The settling time increases the overall time required to fabricate the semiconductor device. The increase in process time decreases the manufacturing throughput of the products.

BRIEF SUMMARY OF THE INVENTION

A table assembly that includes a vibration isolator coupled to a table. A snubber is coupled to both the vibration isolator and the table.

DETAILED DESCRIPTION

Disclosed is a table assembly that includes a snubber coupled to both a table and a vibration isolator. The snubber limits relative movement between the table and vibration isolator so that the isolator can more quickly damp movement by the table. The snubber reduces the settling time of the table when subjected to shock and/or vibration loads.

Figure 1:
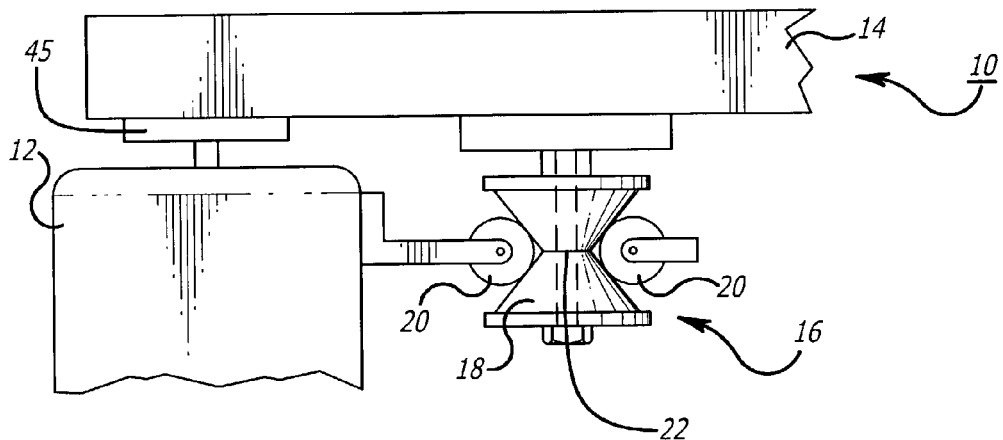
FIG. 1 is a side view of a table assembly.
Figure 2:
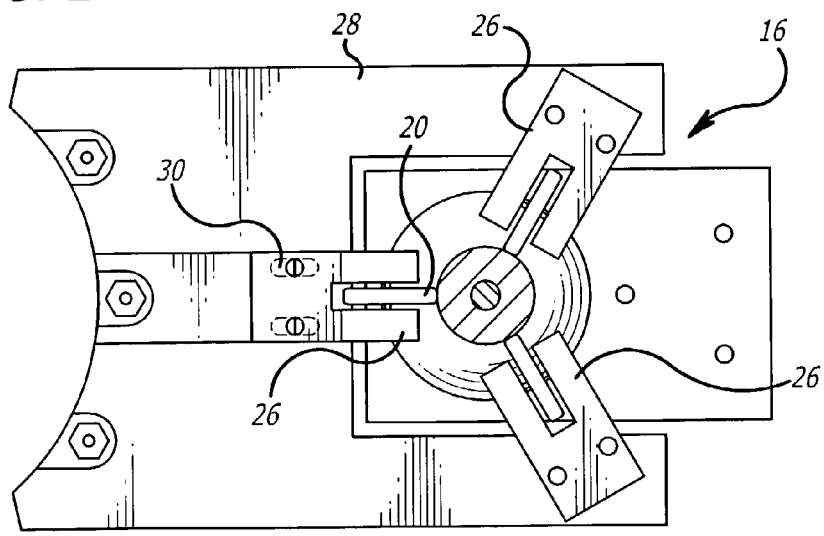
FIG. 2 is a top sectional view of a snubber.

Referring to the drawings more particularly by reference numbers, FIGS. 1 and 2 show a table assembly 10. The assembly 10 includes a vibration isolator 12 coupled to a table 14. By the way of example, the table 14 may function as a platform for semiconductor process equipment. The vibration isolator 12 is typically coupled to the floor (not shown) of a building structure.

The assembly 10 further includes a snubber 16 that limits relative movement between the table 14 and the isolator 12. Limiting movement of the table 14 allows the isolator 12 to more quickly damp the shock and vibration loads applied to the assembly 10.

The snubber 16 may include an elastomer 18 mounted to the table 14 and a plurality of rollers 20 attached to the vibration isolator 12. The rollers 20 are coupled to the elastomer 18 to limit relative movement between the table 14 and isolator 12 in both vertical and horizontal directions.

By way of example, the elastomer 18 may have a conical shape that allows the rollers 20 to be located within a v-shape groove 22. The groove 22 limits the movement of the rollers 20 and vibration isolator 12 relative to the elastomer 18 and table 12. Although a conical shape is shown and described, it is to be understood that the elastomer 18 may have other configurations. For example, the elastomer 18 may have a rectangular slot, or be shaped as a hyperbola.

The elastomer 18 is preferably constructed from an elastomeric material such as rubber, although it is to be understood that element 18 may be constructed from a non-elastomeric material.

The snubber 16 may include three rollers 20. There are preferably three rollers 20 separated by 120 degrees. Such an arrangement ensures that the rollers 20 limit relative movement between the table 14 and isolator 12 in any direction within a horizontal plane.

Each roller 20 may be pivotally connected to a bracket 26. The brackets 26 may be connected to a lower plate 28. The lower plate 28 may have slotted holes 30 that allow the horizontal position of the rollers 20 to be adjusted relative to the elastomer 18.

The elastomer 18 may be mounted to an upper plate 32 that is attached to the table 14. The elastomer 18 may be mounted to the upper plate 32 by a bolt 34 attached to a threaded bracket 36. The vertical position of the elastomer 18 relative to the rollers 20 can be adjusted by turning the threaded bracket 36. Fine adjustment of the vertical position and stiffness of the elastomer can be made by turning the bolt 34.

Figure 3:
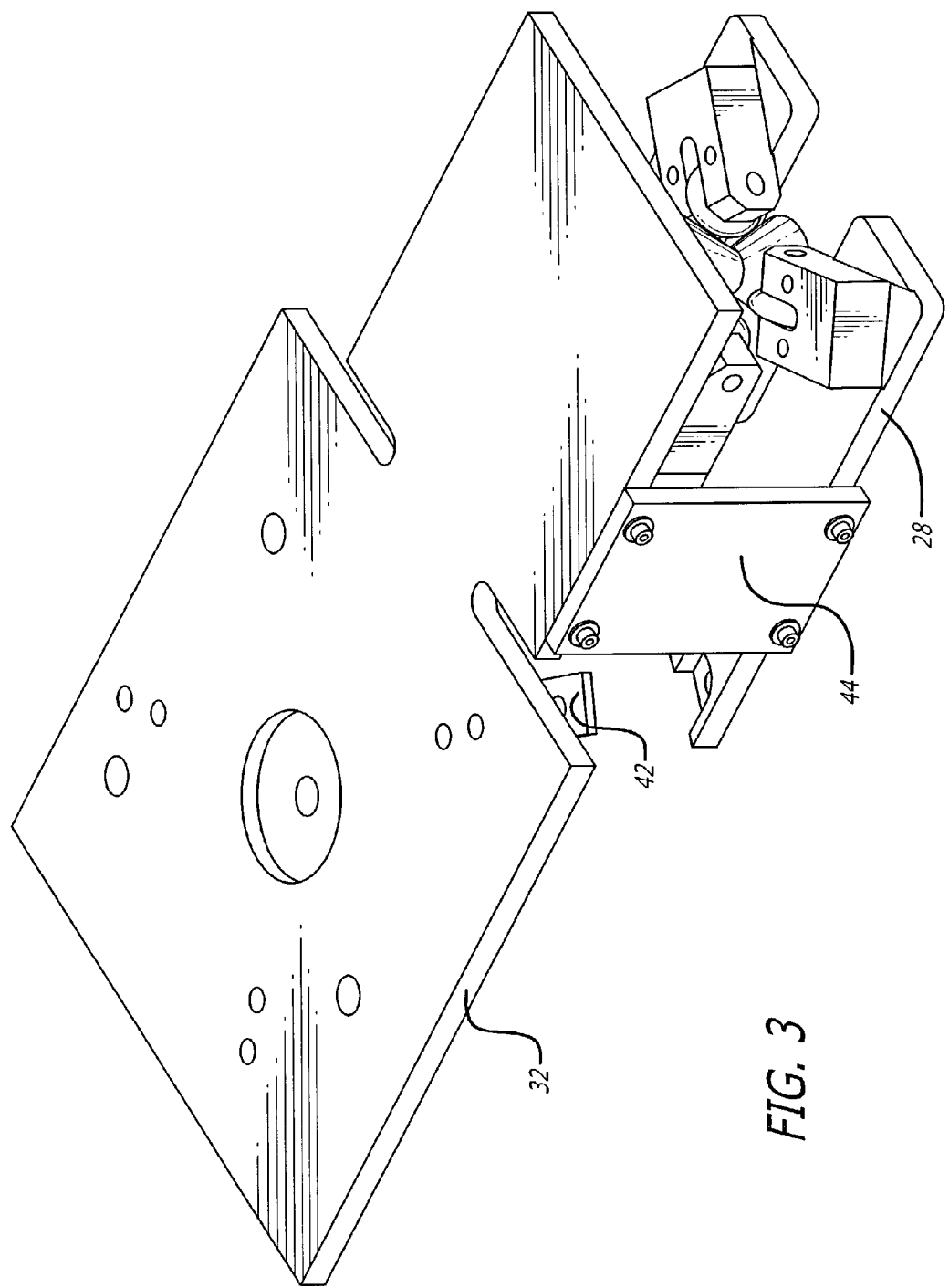
FIG. 3 is a perspective view showing an assembled snubber.
Figure 4:
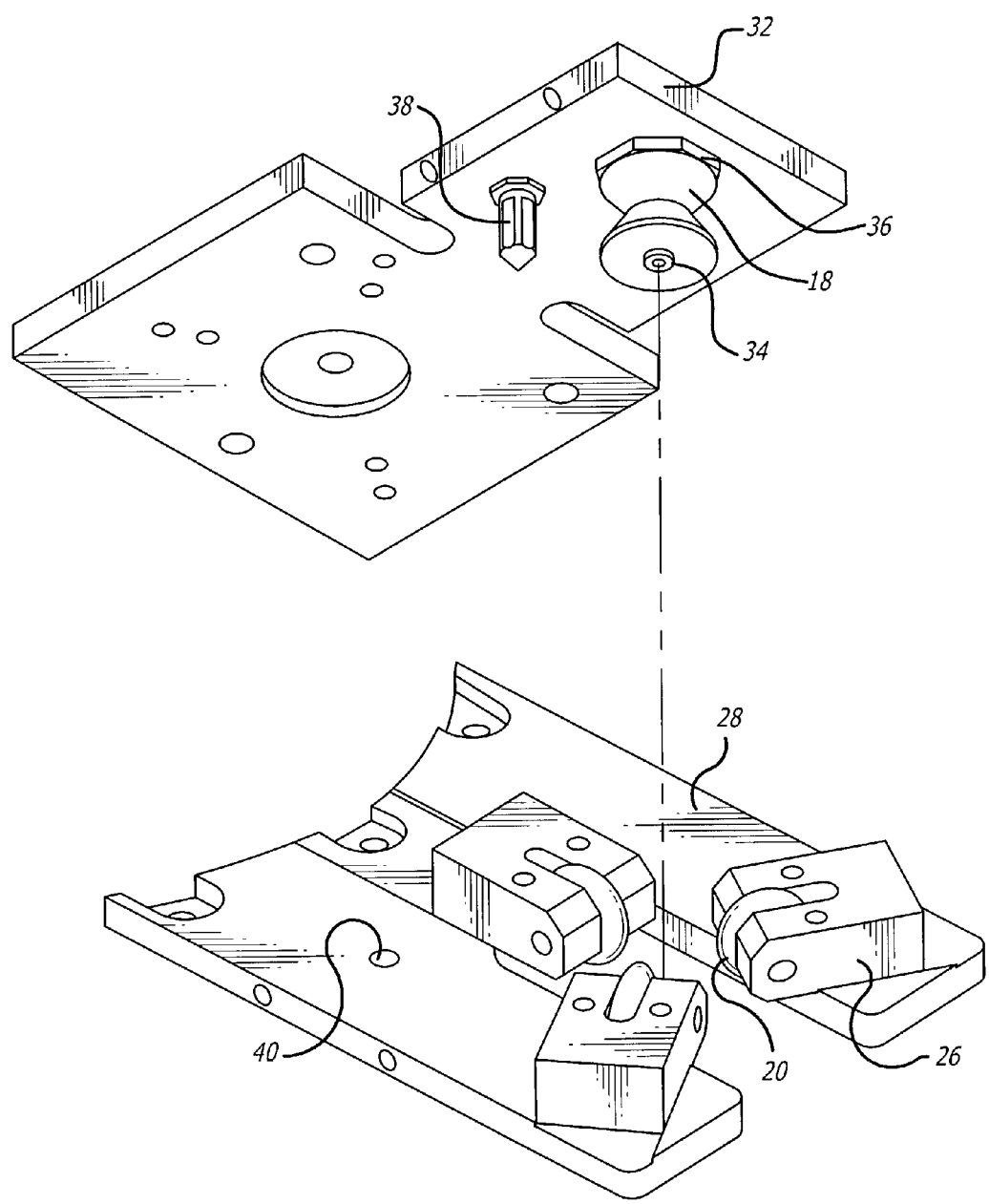
FIG. 4 is an exploded view of the snubber.

As shown in FIGS. 3 and 4, the upper plate 32 may include an alignment pin 38 that can be inserted into an alignment hole 40 of the lower plate 28. The alignment pin 38 and hole 40 allow gross alignment of the elastomer 18 and rollers 20 during the assembly of the snubber 16 to the table 14 and the isolator 12. The upper plate 32 may also have clips 42 that couple directly to the support plate 45 of the vibration isolator 12 to ensure safe connection of the isolator 12 to the table 14 through the upper plate 32. A shipping plate 44 may be attached to the upper 32 and lower 28 plates to allow the snubber 16 to be shipped in a relatively aligned position. The shipping plate 44 improves the ease of assembly. The plate 44 is removed after the snubber 16 is attached to the table 14 and isolator 12.

In operation, a vertical movement of the table 14 will cause the elastomer 18 to engage the rollers 20 and limit such movement. Likewise, a horizontal movement of the table 14 will cause the elastomer 18 to engage one or more rollers 20 to limit such movement.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A table assembly, comprising:
   a table;
   a vibration isolator coupled to said table; and,
   a snubber attached to said table and said vibration isolator, wherein said snubber includes an elastomer mounted to said table, and a roller that is attached to said vibration isolator and coupled to said elastomer.

2. The assembly of claim 1, wherein said elastomer has a conical shape.

3. The assembly of claim 1, wherein said snubber includes a lower plate connected to said roller, said plate having an adjustable slot.

4. The assembly of claim 3, wherein said snubber includes an upper plate that has an alignment pin that is inserted into an alignment hole of said lower plate.

5. The assembly of claim 1, wherein said snubber includes an adjustment fastener coupled to said elastomer.

6. A table assembly, comprising:
   a table;
   a vibration isolator coupled to said table; and,
   snubber means for limiting a movement of said table relative to said vibration isolator, said snubber means includes an elastomer mounted to said table, and a roller that is attached to said vibration isolator and coupled to said elastomer.

7. The assembly of claim 6, wherein said elastomer has a conical shape.

8. The assembly of claim 6, wherein said snubber means includes a lower plate connected to said roller, said plate having an adjustable slot.

9. The assembly of claim 8, wherein said snubber means includes an upper plate that has an alignment pin that is inserted into an alignment hole of said lower plate.

10. The elastomer of claim 6, wherein said snubber means includes an adjustment fastener coupled to said elastomer.

11. A snubber assembly that can be coupled to a table and a vibration isolator, comprising:
    an upper plate adapted to be attached to the table;
    a lower plate adapted to be mounted to the vibration isolator;
    an elastomer mounted to said upper plate; and,
    a plurality of rollers attached to said lower plate and coupled to said elastomer.

12. The assembly of claim 11, wherein said elastomer has a conical shape.

13. The assembly of claim 11, wherein said lower plate has an adjustable slot coupled to said roller.

14. The assembly of claim 11, wherein said upper plate has an alignment pin that is inserted into an alignment hole of said lower plate.

15. The assembly of claim 11, further comprising an adjustment fastener coupled to said elastomer.

* * * * *